United States Patent
Han et al.

(10) Patent No.: US 8,212,619 B2
(45) Date of Patent: Jul. 3, 2012

(54) SPLIT-BIASED CURRENT SCALABLE BUFFER

(75) Inventors: Yiping Han, La Jolla, CA (US); Rajagopalan Rangarajan, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 313 days.

(21) Appl. No.: 12/582,607

(22) Filed: Oct. 20, 2009

(65) Prior Publication Data
US 2011/0018638 A1 Jan. 27, 2011

Related U.S. Application Data

(60) Provisional application No. 61/227,953, filed on Jul. 23, 2009.

(51) Int. Cl.
*H03F 3/04* (2006.01)
(52) U.S. Cl. .......................... 330/296; 330/273; 330/271
(58) Field of Classification Search ................... 330/296, 330/273, 271
See application file for complete search history.

(56) References Cited

U.S. PATENT DOCUMENTS

| | | | | |
|---|---|---|---|---|
| RE29,273 E | * | 6/1977 | Reiffin | 381/121 |
| 5,055,797 A | * | 10/1991 | Chater | 330/268 |
| 5,166,635 A | * | 11/1992 | Shih | 330/253 |
| 5,471,171 A | * | 11/1995 | Itakura et al. | 330/253 |
| 6,278,338 B1 | | 8/2001 | Jansson | |
| 6,385,086 B1 | * | 5/2002 | Mihara et al. | 365/185.11 |
| 6,525,569 B1 | | 2/2003 | Leon | |
| 7,514,998 B2 | * | 4/2009 | Mojarradi et al. | 330/256 |
| 7,944,302 B2 | * | 5/2011 | Adams | 330/267 |
| 2009/0153248 A1 | | 6/2009 | Sun et al. | |

FOREIGN PATENT DOCUMENTS

| | | |
|---|---|---|
| JP | 2000354055 A | 12/2000 |
| WO | WO03061124 A2 | 7/2003 |

OTHER PUBLICATIONS

International Search Report and Written Opinion—PCT/US2010/043155—ISA/EPO—Dec. 6, 2010 (092641WO).

* cited by examiner

*Primary Examiner* — Patricia Nguyen
(74) *Attorney, Agent, or Firm* — Ramin Mobarhan

(57) ABSTRACT

Disclosed are circuits, techniques and methods for buffering a high frequency signal for transmission over an integrated circuit. In one particular implementation, a plurality of amplification circuits are individually biased for amplifying a signal from a voltage controlled oscillator and/or digitally controlled oscillator to provide a local oscillator signal on a device.

26 Claims, 3 Drawing Sheets

SPLIT-BIASED CURRENT SCALABLE BUFFER

CLAIM OF PRIORITY UNDER 35 U.S.C. §119

The present application for patent claims priority to Provisional Application No. 61/227,953, entitled "Split-Biased Current Scalable Buffer" filed Jul. 23, 2009, and assigned to the assignee hereof and hereby expressly incorporated by reference herein.

BACKGROUND

In today's multi-band, multi-mode integrated radio frequency (RF) transceivers, due to the extended larger chip size and the complex local oscillator (LO) generation scheme, high frequency buffers are usually needed to drive the long LO lines without degrading the DCO/VCO performance as well as providing enough signal strength for LO generators that may follow. Traditionally, a self-biased inverter type buffer was widely used. However, under extreme process conditions, and/or lower supply voltage, for example, simulation shows that a self-biased inverter type buffer may lose its amplification capability due to the increased Vth and limited headroom. Process conditions become increasingly acute as processing transitions to smaller technology nodes. As such, current consumption of a self-biased buffer can be even higher than that of a DCO/VCO used for providing an oscillating input signal. Also, an LO scheme which is scalable to current consumption based on different operation modes and/or process-voltage-temperature (PVT) corners may help to satisfy increasing low-power requirements for RF transceivers.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments and is not intended to represent the only embodiments covered by claimed subject matter. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. It will be apparent to those skilled in the art that exemplary embodiments of may be practiced without these specific details. In some instances, well known structures and devices are shown in block diagram form in order to avoid obscuring the novelty of exemplary embodiments presented herein.

As pointed out above, increasing chip size has led to increased current consumption in connection with complex local oscillator (LO) schemes. In one exemplary embodiment, a buffer circuit comprising an input terminal may receive an oscillating input signal from a voltage controlled oscillator (VCO) and/or digitally controlled oscillator (DCO). The input signal may be received at first and second amplification circuits having output terminals being coupled together to provide an amplified LO signal. A biasing circuit may individually bias the first and second amplification circuits at different voltages.

By individually biasing amplifiers in a buffer circuit, the buffer circuit may drive an LO signal over longer lines and/or with larger loads while reducing current consumption. Additionally, such a buffer circuit may provide improved isolation of a VCO and/or DCO from LO signal lines. Also, such a buffer circuit may enable scalable current consumption that can be varied according to changing applications, dynamic loads, and/or variations in process-voltage-temperature (PVT) corners. For example, particular exemplary embodiments are directed to reducing LO current consumption as well as amplify a 6 GHz RF signal at extreme PVT conditions (e.g., 1.25V/SS/−30, 1.05V/SS/−30 C, etc.).

Figure 1:
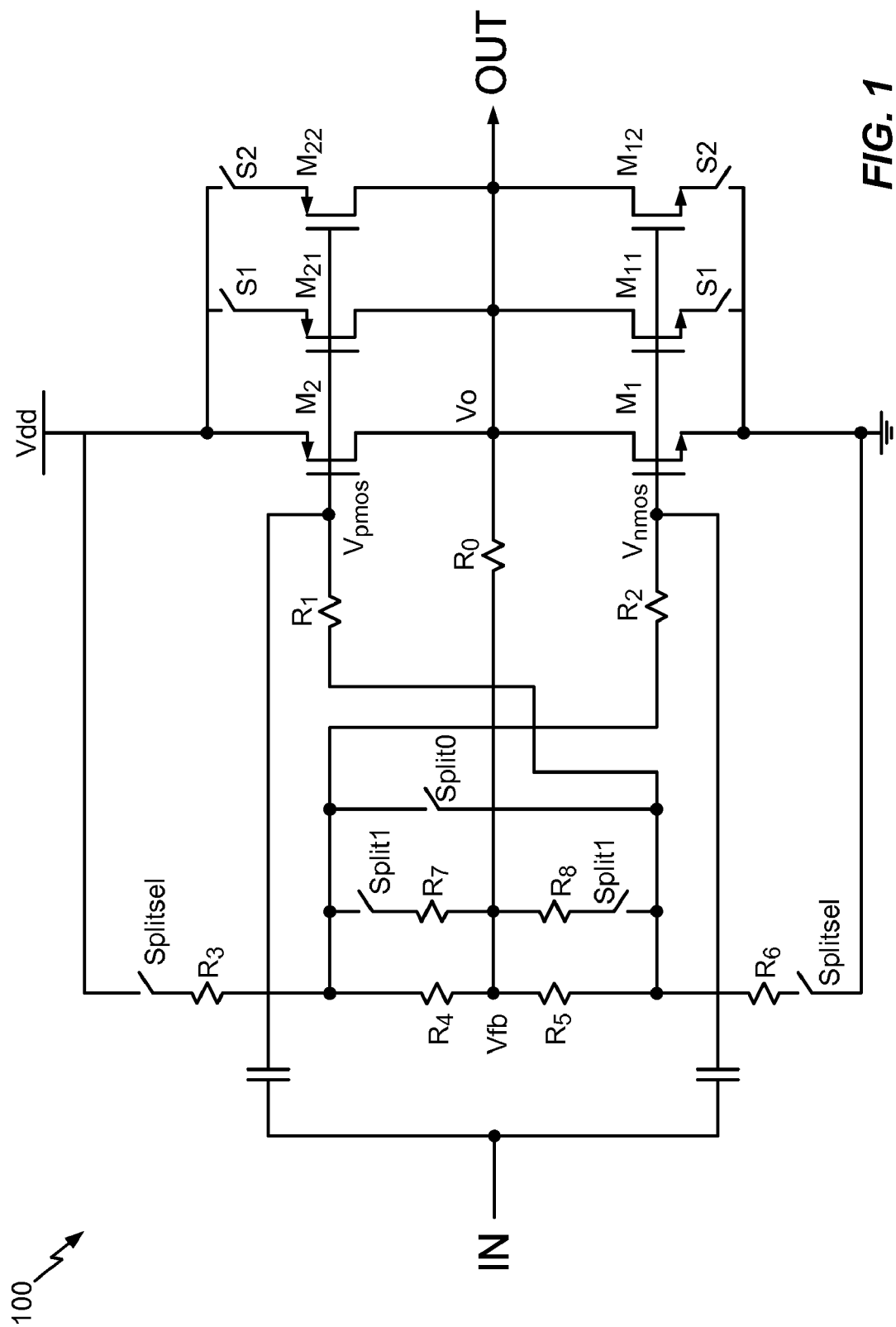
FIG. 1 is a schematic diagram of a buffer circuit according to an embodiment.

FIG. 1 is a schematic diagram of a buffer circuit according a particular implementation. Here, buffer circuit 100 may be implemented in any one of several types of devices that distribute an LO signal such as, for example, radio frequency (RF) transceivers, programmable processors, XO buffers used in local crystal oscillator applications, pre-driver amplifiers for transmitters, just to name a few examples. It should be understood, however, that these are merely example applications of a buffer circuit and that claimed subject matter is not limited in this respect.

In the particular exemplary embodiment of FIG. 1, switches Split0, Split1 and/or Splitsel may be set to configure buffer circuit 100 to behave as a self-biased buffer circuit or a split-bias circuit. In a split-bias configuration, buffer circuit 100 may be configured to individually bias first and second amplification circuits. As shown in the schematic diagram of FIG. 1, an input signal IN may be provided by a VCO and/or DCO (not shown) to generate an output signal OUT as an LO signal. A voltage divider formed by a configuration of resistors may apportion Vdd between a first amplification circuit formed by pmos transistors $M_2$, $M_{21}$ and $M_{22}$, and a second amplification circuit formed by nmos transistors $M_1$, $M_{11}$ and $M_{12}$. As shown different bias voltages Vpmos and Vnmos are applied to the transistor gates of these two amplification circuits. Accordingly, the two amplification circuits are separately and/or individually biased.

In one example implementation, buffer circuit 100 may be configured to be in a self-bias mode by closing switch Split0, and opening switches Split1 and Splitsel. Here, by closing Split0, resistors $R_4$, $R_5$, $R_7$ and $R_8$ are removed from the circuit to apportion Vdd about evenly between bias voltages Vpmos and Vnmos. It should be understood, however, that this is merely one example of how a buffer circuit may be configured in a self-bias mode, and claimed subject matter is not limited in this respect.

In another example implementation, buffer circuit 100 may be configured be in a self-bias mode by closing switches Splitsel, and opening switch switches Split0. With maintaining switches Switch1 in a closed state, Vdd is apportioned between bias voltages Vpmos and Vnmos using a voltage divider formed by resistors $R_4$ and $R_5$ according to expressions (1) as follows:

$$V_{pmos} = V_{dd} \frac{R_6}{R_3 + R_4 + R_5 + R_6}, \quad (1)$$

$$V_{nmos} = V_{dd} \frac{R_4 + R_5 + R_6}{R_3 + R_4 + R_5 + R_6}$$

In this particular split bias configuration, bias voltages Vpmos and Vnmos are maintained at different voltages. In one particular numerical example, for the purpose of illustration, output voltage $V_o$ may be maintained at about 0.6 volts while Vpmos and Vnmos are maintained at about 700 mV and 600 mV, respectively. In another particular split bias configuration, switches Split1 may be placed in a closed state such that Vdd is apportioned between bias voltages Vpmos and Vnmos using a voltage divider formed by resistors $R_4$ and $R_5$, $R_7$ and $R_8$ according to expressions (2) as follows:

$$V_{pmos} = V_{dd} \left[ \frac{R_6}{R_3 + \frac{R_4 R_7}{R_4 + R_7} + \frac{R_5 R_8}{R_5 + R_8} + R_6} \right], \quad (2)$$

$$V_{nmos} = V_{dd} \left[ \frac{\frac{R_4 R_7}{R_4 + R_7} + \frac{R_5 R_8}{R_5 + R_8} + R_6}{R_3 + \frac{R_4 R_7}{R_4 + R_7} + \frac{R_3 R_8}{R_5 + R_8} + R_6} \right].$$

In this particular split bias configuration, bias voltages Vpmos and Vnmos are also maintained at different voltages. However, the difference between bias voltages Vpmos and Vnmos in this particular configuration (as shown by expression (2)) is less than the difference between bias voltages Vpmos and Vnmos in the previous example split bias configuration (as shown by expressions (1)). By reducing the separation of Vpmos and Vnmos, buffer circuit 100 can be configured to operate with a lower power output and consumption. Accordingly, switches Split1 may be closed for applications requiring lower output power by reducing the separation of Vpmos and Vnmos.

As discussed above, buffer circuit 100 may be configured for different power output levels by setting states of switches Split0, Split1 and/or Splitsel. Power output may be further varied by varying a number of output amplification stages through setting switches S1 and S2. In FIG. 1, amplification circuits are shown with three transistors each (pmos transistors $M_2$, $M_{21}$ and $M_{22}$ for a first amplification circuit and nmos transistors $M_1$, $M_{11}$ and $M_{12}$ for a second amplification circuit). It should be understood, however that such amplification circuits may have fewer or more than three transistors. Thus, this particular buffer circuit design is scalable according to particular current consumption requirements and/or loads at output terminal OUT. Additionally, switch pairs S1 and S2 may be opened or closed depending on particular current consumption/amplification requirements, and/or loading at output terminal OUT. Here, if switch pairs S1 and S2 are opened, transistors $M_{21}$ and $M_{22}$ are removed from the first amplification circuit and transistors $M_{11}$ and $M_{12}$ are removed from the second amplification circuit. Such a resulting buffer circuit may be applicable for applications with a lower load and/or a lower current consumption requirement. Such a buffer circuit may be incrementally expanded by closing switch pair S1, and then closing switch pair S2 for application to higher loads, for example. It should be understood, however, that this is merely one particular example of how a buffer circuit may be switchably scaled for adaptation to different loads and/or current consumption requirements, and that claimed subject matter is not limited in this respect.

In the particular exemplary embodiment of FIG. 1, pmos transistors $M_2$, $M_{21}$ and $M_{22}$ have respective gate terminals coupled to bias voltage Vpmos and respective source terminals coupled to output terminal OUT. Similarly, transistors $M_1$, $M_{11}$ and $M_{12}$ have respective gate terminals coupled to bias voltage Vmmos and respective drain terminals coupled to output terminal OUT. Here, in the aforementioned split bias configurations, an output current at output terminal OUT is fed back to bias voltages Vpmos and Vnmos through resistor $R_0$ forming a common mode feedback (CMFB) loop to provide an output common mode voltage. Accordingly, particular embodiments are capable of establishing stable bias voltages Vpmos and Vnmos.

In the particular exemplary embodiment of FIG. 1, a CMFB loop feeds a current back from the output current at output terminal OUT through voltage divider resistors and resistor $R_2$ to bias voltage Vnmos at a gate terminal of transistor $M_1$. Similarly, CMFB loop 102 feeds a current back from the output current at output terminal OUT through voltage divider resistors and resistor $R_1$ to bias voltage Vpmos at a gate terminal of transistor $M_2$. It should be understood, however, that this is merely an example of a CMFB circuit that may be employed for individually biasing multiple amplification circuits in a buffer circuit and claimed subject matter is not limited in this respect.

Exemplary embodiments of allow for amplification of a weak RF signal at unfavorable PVT conditions, implementation over a small die area and/or coverage over an ultra-wide bandwidth (2.8 GHz~6.3 GHz). Table 1 summarizes particular configurable example implementations of an input buffer circuit in a self-bias or split-bias modes shown in FIG. 1 under different process corners as indicated. In these examples, Vdd may be set at 1.1V. Also, process corner "TT" indicates that both NMOS and PMOS transistors are typical, process corner "FS" indicates that the NMOS transistors are faster (stronger) than typical while the PMOS transistors are slower (weaker) than typical, process corner "SF" indicates that the NMOS transistors are slower (weaker) than typical while the PMOS transistors are faster (stronger) than typical, process corner "SS" indicates that the NMOS transistors and PMOS transistors are slower (weaker) than typical, and process corner "FF" indicates that the NMOS transistors and PMOS transistors are faster (stronger) than typical.

TABLE 1

| Splitsel | Split1 | Split0 | S1 | S2 | Power | Process corner |
|---|---|---|---|---|---|---|
| 1 | 0 | 0 | 1 | 1 | Highest | |
| 1 | 1 | 0 | 1 | 1 | | SS, high power |
| 1 | 1 | 1 | 1 | 1 | | SS, low power |
| 1 | 1 | 1 | 1 | 0 | | TT, high power |
| 1 | 1 | 1 | 0 | 0 | | FF, high power |
| 0 | x | x | 1 | 1 | | TT, low power |
| 0 | x | x | 1 | 0 | | FF, low power |
| 0 | x | x | 0 | 0 | Lowest | |

Here, in Table 1 configurations are ranked from highest to lowest power output for different circuit configurations and process corners. It should be understood, however, that these are mere example process corners and selectable circuit configurations, and that different process corners and selectable circuit configurations may be used without deviating from claimed subject matter. As such, in particular implementations, switches Split0, Split1, Splitsel, S1 and S2 may be selectively opened and closed based, at least in part, on a particular process corner associated with a device that incorporates the buffer circuit of FIG. 1 and desired power output.

Figure 2:
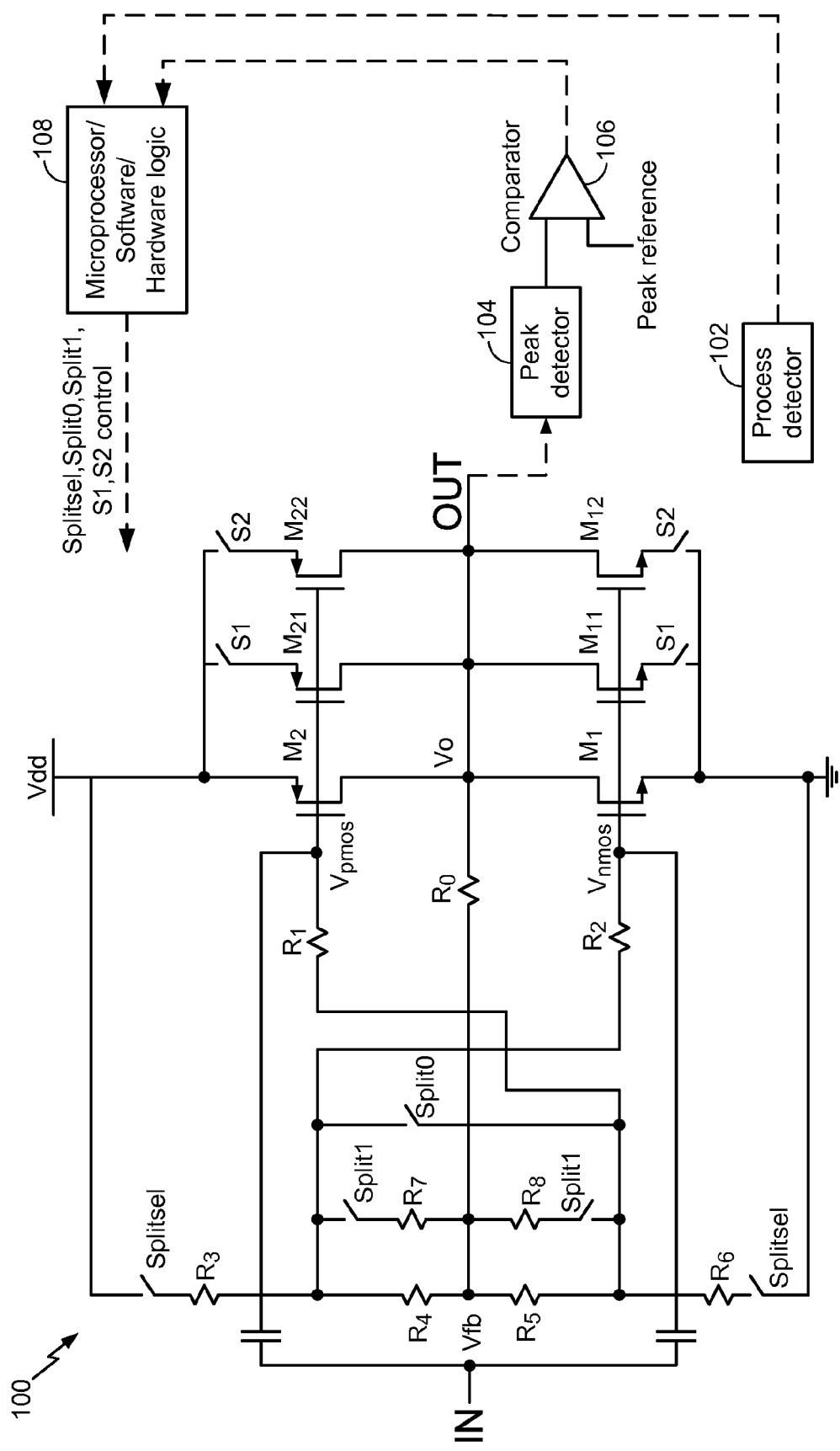
FIG. 2 is a schematic diagram of a system for affecting a configuration of a buffer circuit according to an embodiment.

FIG. 2 shows an example implementation of buffer circuit 100 which is configurable by logic 108 responsive to detected conditions. In particular embodiments, logic 108 may be implemented externally from an integrated device incorporating buffer circuit 100 or as part of a built-in self-test circuit, for example. Logic 108 may be implemented as software executable by a microprocessor and/or hardwired logic. Here, logic 108 is capable of setting states of switches Split0, Split1, Splitsel, S1 and/or S2 responsive to detection of process conditions at process detector 102 and/or output signal OUT. For example, logic 108 may adjust power output of buffer circuit 100 up or down based upon a comparison of measured peak output voltage with a peak reference voltage. Also, logic 108 may determine from process detector 102 a particular process corner used to implement buffer circuit 100, and set states of switches Split0, Split1, Splitsel, S1 and/or S2 to provide a desired output level as indicated by examples in Table 1 above.

Figure 3:
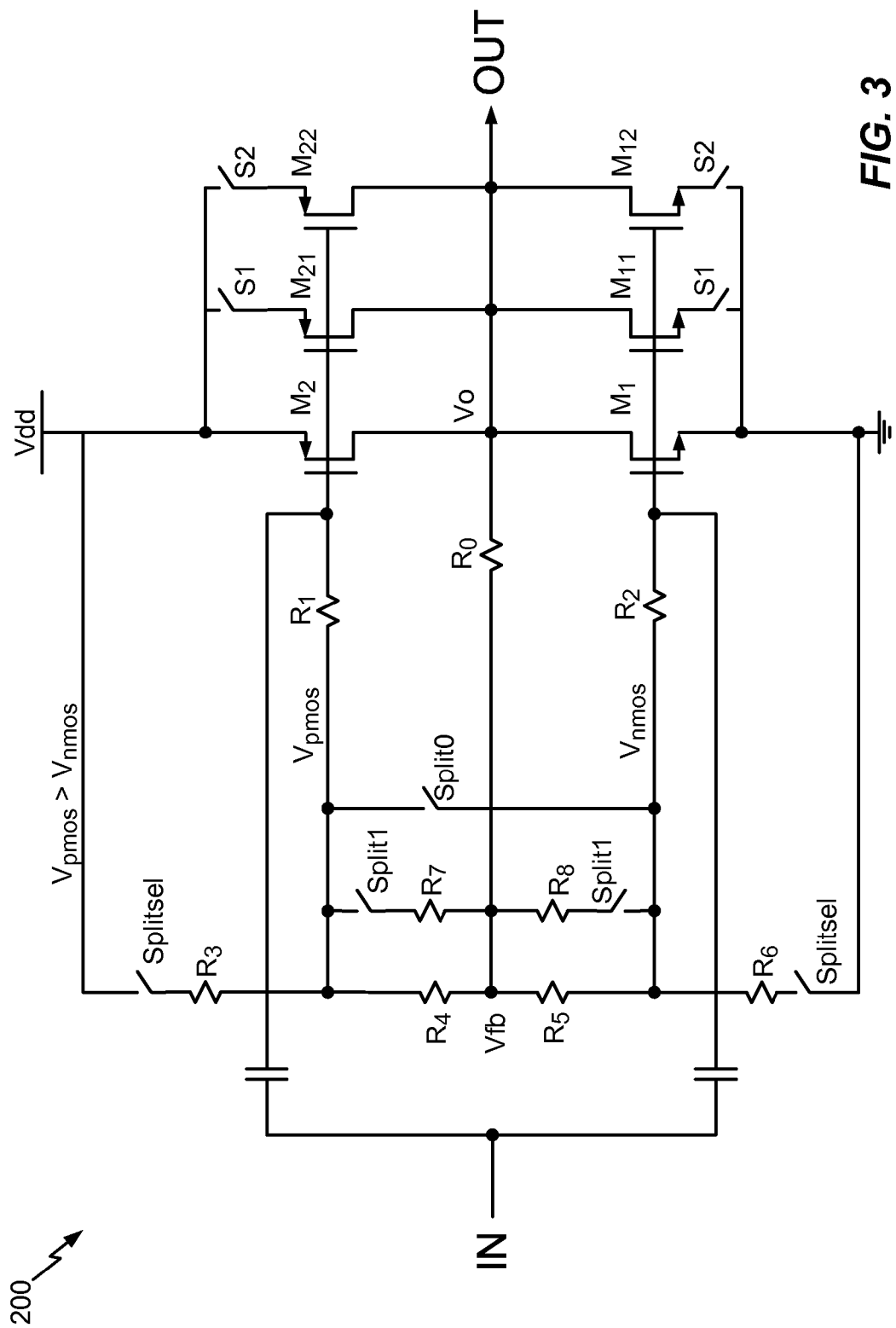
FIG. 3 is a schematic diagram of a buffer circuit according to an alternative embodiment.

FIG. 3 is a schematic diagram of a buffer circuit 200 that is configurable to operate in a split bias mode at relatively low power. Here, buffer circuit 200 differs from buffer circuit 100 in that bias voltages Vpmos and Vnmos applied to amplification circuits are swapped. Here, in this particular embodiment, Vpmos is greater than Vnmos. As such, power output of particular split bias configurations may be lower than other particular self bias configurations. It should be understood, however, that this is merely an example configuration, and that claimed subject matter is not limited in this respect.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit comprising:
an input terminal to receive an oscillating input signal;
first and second amplification circuits having output terminals being coupled together to provide an amplified local oscillator signal responsive to said input signal, each of the first and second amplification circuits switchably scalable based on at least one operation condition; and
a biasing circuit to individually bias said first and second amplifiers.

2. The circuit of claim 1, wherein an output voltage of said amplified local oscillator signal is controlled in response to a common mode feedback signal.

3. The circuit of claim 2, wherein said biasing circuit comprises a voltage divider and said common mode feedback signal applies a current to said voltage divider.

4. The circuit of claim 1, and further comprising one or more switches to selectively alter bias voltages applied to said first and second amplification circuits.

5. The circuit of claim 4, wherein said biasing circuit comprises a voltage divider comprising one or more resistances which are alterable responsive to said one or more switches to affect said bias voltages applied to said first and second amplification circuits.

6. The circuit of claim 1, and further comprising one or more switches to selectively adapt said circuit to an output load and/or power consumption.

7. The circuit of claim 6, wherein said one or more switches are capable of coupling and/or decoupling at least one transistor to at least one of said amplification circuits.

8. The circuit of claim 6, and further comprising logic to selectively set a state of one or more of said switches responsive to a detected peak level of an output signal.

9. The circuit of claim 1, wherein bias voltages applied to said first and second amplification circuits are affected in response to a detected process corner.

10. The circuit of claim 1, wherein said first amplification circuit comprises one or more cascaded pmos transistors and said second amplification circuit comprises one or more cascaded nmos transistors.

11. The circuit of claim 10, wherein said first amplification circuit is biased at a higher voltage than said second amplification circuit.

12. The circuit of claim 10, wherein said second amplification circuit is biased at a higher voltage than said first amplification circuit.

13. The circuit of claim 1, wherein said biasing circuit comprises a voltage divider.

14. The circuit of claim 13, wherein said voltage divider is switchably configurable to alter bias voltages applied to said first and second amplification circuits.

15. A method comprising:
receiving an oscillating input signal;
applying said input signal to first and second amplification circuits to provide an amplified local oscillator signal, each of the first and second amplification circuits switchably scalable based on at least one operation condition; and
applying bias voltages individually to said first and second amplification circuits.

16. The method of claim 15, and further comprising altering bias voltages applied to said first and second amplification circuits by setting states of one or more switches.

17. The method of claim 15, and further comprising setting states of one or more switches to selectively adapt said circuit to an output load and/or power consumption.

18. The method of claim 17, wherein said one or more switches are capable of coupling and/or decoupling at least one transistor to at least one of said amplification circuits.

19. The method of claim 17, and further comprising selectively setting at least one of said states responsive to a detected peak level of an output signal.

20. The method of claim 1, and further comprising affecting bias voltages applied to said first and second amplification circuits based, at least in part, on a detected process corner.

21. An apparatus comprising:
means for receiving an oscillating input signal;
means for applying said input signal to first and second amplification circuits to provide an amplified local oscillator signal, each of the first and second amplification circuits switchably scalable based on at least one operation condition; and
means for applying bias voltages individually to said first and second amplification circuits.

22. The apparatus of claim 21, and further comprising means for altering bias voltages applied to said first and second amplification circuits by setting states of one or more switches.

23. The apparatus of claim 21, and further comprising means for setting states of one or more switches to selectively adapt said circuit to an output load and/or power consumption.

24. The apparatus of claim 23, wherein said one or more switches are capable of coupling and/or decoupling at least one transistor to at least one of said amplification circuits.

25. The apparatus of claim 23, and further comprising means for selectively setting at least one of said states responsive to a detected peak level of an output signal.

26. The method of claim 21, and further comprising means for affecting bias voltages applied to said first and second amplification circuits based, at least in part, on a detected process corner.

* * * * *